(12) United States Patent
Watkins et al.

(10) Patent No.: US 12,099,294 B2
(45) Date of Patent: Sep. 24, 2024

(54) PATTERNING OF COMPLEX METAL OXIDE STRUCTURES

(71) Applicant: University of Massachusetts, Boston, MA (US)

(72) Inventors: James J. Watkins, South Hadley, MA (US); Irene R. Howell, Amherst, MA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 16/650,510

(22) PCT Filed: Sep. 28, 2018

(86) PCT No.: PCT/US2018/053442
§ 371 (c)(1),
(2) Date: Mar. 25, 2020

(87) PCT Pub. No.: WO2019/067912
PCT Pub. Date: Apr. 4, 2019

(65) Prior Publication Data
US 2020/0285145 A1    Sep. 10, 2020

Related U.S. Application Data

(60) Provisional application No. 62/565,703, filed on Sep. 29, 2017.

(51) Int. Cl.
*G03F 7/00* (2006.01)
*B05D 1/00* (2006.01)
(Continued)

(52) U.S. Cl.
CPC .......... *G03F 7/0002* (2013.01); *B05D 1/005* (2013.01); *C23C 16/045* (2013.01); *C23C 16/405* (2013.01); *C23C 16/45525* (2013.01)

(58) Field of Classification Search
CPC . C23C 16/45525–45555; C23C 16/045; G03F 7/0002
See application file for complete search history.

(56) References Cited

U.S. PATENT DOCUMENTS

2004/0228967 A1\* 11/2004 Leung ............... H01L 21/02282
427/372.2
2007/0049028 A1    3/2007 Subramanian et al.
(Continued)

FOREIGN PATENT DOCUMENTS

JP    2006150741    6/2006
JP    6101897        3/2017
(Continued)

OTHER PUBLICATIONS

"International Application Serial No. PCT/US2018/053442, International Preliminary Report on Patentability mailed Apr. 9, 2020", 10 pgs.
(Continued)

*Primary Examiner* — Alex A Rolland
(74) *Attorney, Agent, or Firm* — Schwegman Lundberg & Woessner, P.A.

(57) ABSTRACT

Various embodiments disclosed relate to methods of manufacturing textured surfaces nanoimprint lithography with nanoparticulate inks. The present invention provides methods that allow flexible patterning of substrates with features having complex geometries.

15 Claims, 3 Drawing Sheets

(51) Int. Cl.
  *C23C 16/04* (2006.01)
  *C23C 16/40* (2006.01)
  *C23C 16/455* (2006.01)

(56) References Cited

U.S. PATENT DOCUMENTS

| | | | |
|---|---|---|---|
| 2009/0046362 | A1 | 2/2009 | Guo et al. |
| 2012/0237677 | A1 | 9/2012 | Korampally et al. |
| 2012/0305061 | A1 | 12/2012 | O'brien et al. |
| 2013/0273337 | A1 | 10/2013 | Yu et al. |
| 2014/0004381 | A1* | 1/2014 | Elam ............... C23C 16/45555 428/688 |
| 2014/0072720 | A1* | 3/2014 | Watkins ............... H01B 3/10 427/487 |
| 2015/0004692 | A1 | 1/2015 | Le Berre et al. |

FOREIGN PATENT DOCUMENTS

| | | |
|---|---|---|
| JP | 2019504464 | 2/2019 |
| JP | 2020536722 | 12/2020 |
| JP | 7267624 | 4/2023 |
| JP | 2023100605 | 7/2023 |
| KR | 101618436 B1 | 5/2016 |
| KR | 102655297 B1 | 4/2024 |
| WO | WO-2019067912 A1 | 4/2019 |

OTHER PUBLICATIONS

"European Application Serial No. 18862056.1, Response to Communication pursuant to Rules 161(2) and 162 EPC filed Nov. 23, 2020", 14 pgs.
"European Application Serial No. 18862056.1, Extended European Search Report mailed Jun. 8, 2021", 13 pgs.
Schwarz, Daniel, "Validity of Lorentz-Lorenz equation in porosimetry studies", Thin Solid Films, vol. 519, No. 9, (2010), 2994-2997.
"International Application Serial No. PCT/US2018/053442, International Search Report mailed Jan. 28, 2019", 4 pgs.
"International Application Serial No. PCT/US2018/053442, Invitation to Pay Additional Fees and Partial Search Report mailed Nov. 19, 2018", 2 pgs.
"International Application Serial No. PCT/US2018/053442, Written Opinion mailed Jan. 28, 2019", 8 pgs.
Kothari, Rohit, et al., "Direct Patterning of Robust One-Dimensional, Two-Dimensional, and Three-Dimensional Crystalline Metal Oxide Nanostructures Using Imprint Lithography and Nanoparticle Dispersion Inks", ACS Publications DOI: 10.1021/acs.chemmater.6b05398 Chem. Mater. 2017, 29, (2017), 3908-3918.
Ott, A W, et al., "Al3O3 thin film growth on Si (100) using binary reaction sequence chemistry", Thin Solid Films, vol. 292, (Jan. 5, 1997), 135-144.
"European Application Serial No. 18862056.1, Response filed Dec. 29, 2021 to Extended European Search Report mailed Jun. 8, 2021", 18 pages.
"Japanese Application Serial No. 2020-517961, Notification of Reasons for Refusal mailed Aug. 2, 2022", w English translation, 5 pgs.
"Japanese Application Serial No. 2020-517961, Response Filed Nov. 2, 2022 to Notification of Reasons for Refusal mailed Aug. 2, 2022", W English Claims, 15 pgs.
"Japanese Application Serial No. 2020-517961, Notification of Reasons for Refusal mailed Dec. 20, 2022", w English Translation, 6 pgs.
"Korean Application 10-2020-7012137, Voluntary Amendment Filed Jul. 14, 2023", W English Claims, 15 pgs.
"Japanese Application Serial No. 2020-517961, Response Filed Mar. 20, 2023 to Notification of Reasons for Refusal mailed Dec. 20, 2022", W English Claims, 7 pgs.
"Japanese Application Serial No. 2023-043988, Voluntary Amendment Filed Apr. 21, 2023", W English Claims, 45 pgs.
"Korean Application Serial No. 10-2024-7009001, Notice of Preliminary Rejection mailed Apr. 3, 2024", w/ English translation, 12 pgs.
"Korean Application Serial No. 10-2020-7012137, Notice of Preliminary Rejection mailed Oct. 23, 2023", w/ English Translation, 5 pgs.
"Korean Application Serial No. 10-2020-7012137, Response Filed Dec. 22, 2023 to Notice of Preliminary Rejection mailed Oct. 23, 2023", W/ English Claims, 15 pgs.

* cited by examiner

PATTERNING OF COMPLEX METAL OXIDE STRUCTURES

CROSS-REFERENCE TO RELATED APPLICATION

This application claims the benefit of priority to U.S. Provisional Patent Application Ser. No. 62/565,703 filed Sep. 29, 2107, the disclosure of which is incorporated herein in its entirety by reference.

STATEMENT OF GOVERNMENT SUPPORT

This application is a U.S. National Stage Filing under 35 U.S.C. 371 from International Application No. PCT/US2018.053442, filed on Sep. 28, 2018, which claims the benefit of priority to U.S. Provisional Patent Application Ser. No. 62/565,703 filed Sep. 29, 2107, the disclosures of which are incorporated herein in their entireties by reference.

BACKGROUND

Nanostructured metal, metal oxide and metal nitride structures are of interest for application as optics and metamaterials and metasurfaces. Many applications, including optical and metamaterial/metasurfaces require complex geometries. These include high aspect ratio structures (height:width in excess of 4:1), structures of varying tilt angles with respect to the normal of the substrate surface (e.g. blaze gratings) and patterns of features in which the individual components differ in height, orientation and/or in which the areal density of features vary significantly (e.g. some areas of the patterns contain a high density of features spaced closely together and other areas of the pattern either do not contain features or contain a relatively sparse population of features that are spaced far apart relative to feature size). Each of these requirements can be difficult to meet using conventional nanoimprint lithography.

SUMMARY OF THE INVENTION

A method of manufacturing a textured surface, is provided. The method includes disposing a template on a substrate and planarizing the template with a nanoparticulate ink.

A method of manufacturing a textured surface, is provided. The method includes planarizing an imprinted template with a nanoparticulate ink to form a transfer print master and contacting the transfer print master with a substrate.

A method of manufacturing a textured surface is provided. The method includes disposing a template on a substrate, imprinting the template with a mold comprising a plurality of features that penetrate the template to form an imprinted template, planarizing the imprinted template with a nanoparticulate ink, annealing the nanoparticulate ink, removing the imprinted template. In the method, the imprinting creates imprinted features in the template substantially corresponding in shape and position to the features on the mold, the nanoparticulate ink substantially fills the imprinted features in the template, and the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

A method of manufacturing a textured surface, is provided. The method includes disposing a template on a first substrate, imprinting the template with a mold comprising a plurality of features that penetrate the template to form an imprinted template, planarizing the imprinted template with a nanoparticulate ink to form a transfer print master, annealing the nanoparticulate ink, contacting the transfer print master with a second substrate, and removing the transfer print master to provide a plurality of features disposed on the second substrate. In the method, the imprinting creates imprinted features in the template substantially corresponding in shape and position to the features on the mold, the nanoparticulate ink substantially fills the imprinted features in the template, and the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

In various embodiments, the present method can easily manufacture complex structural geometries with a wide variety of features sizes and feature distribution on a surface. In various embodiments, advantages of the present invention relative to the state of the art include relatively low degrees of feature shrinkage upon calcination of other post processing treatments and mechanical robustness. Advantageously, in various embodiments the method allows for the manufacture of high aspect ratio structures (height:width in excess of 4:1), structures of varying tilt angles with respect to the normal of the substrate surface, and patterns of features in which the individual components differ in height, orientation and/or in which the areal density of features vary significantly. Advantageously, in various embodiments the method allows for the manufacture of patterns containing a high density of features spaced closely together and other areas of the pattern either do not contain features or contain a relatively sparse population of features that are spaced far apart relative to feature size.

BRIEF DESCRIPTION OF THE FIGURES

In the drawings, which are not necessarily drawn to scale, like numerals describe substantially similar components throughout the several views. The drawings illustrate generally, by way of example, but not by way of limitation, various embodiments of the present invention. The features displayed in the drawings are not to scale and are intended only for illustrative purposes and for clarity.

DETAILED DESCRIPTION OF THE INVENTION

Reference will now be made in detail to certain embodiments of the disclosed subject matter, examples of which are illustrated in part in the accompanying drawings. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section.

In the methods described herein, the acts can be carried out in any order without departing from the principles of the invention, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. The term "substantially free of" as used herein can mean having none or having a trivial amount of, such that the amount of material present does not affect the material properties of the composition including the material, such that the composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less. The term "substantially free of" can mean having a trivial amount of, such that a composition is about 0 wt % to about 5 wt % of the material, or about 0 wt % to about 1 wt %, or about 5 wt % or less, or less than, equal to, or greater than about 4.5 wt %, 4, 3.5, 3, 2.5, 2, 1.5, 1, 0.9, 0.8, 0.7, 0.6, 0.5, 0.4, 0.3, 0.2, 0.1, 0.01, or about 0.001 wt % or less, or about 0 wt %.

The term "substituted" as used herein in conjunction with a molecule or an organic group as defined herein refers to the state in which one or more hydrogen atoms contained therein are replaced by one or more non-hydrogen atoms. The term "functional group" or "substituent" as used herein refers to a group that can be or is substituted onto a molecule or onto an organic group. Examples of substituents or functional groups include, but are not limited to, a halogen (e.g., F, Cl, Br, and I); an oxygen atom in groups such as hydroxy groups, alkoxy groups, aryloxy groups, aralkyloxy groups, oxo(carbonyl) groups, carboxyl groups including carboxylic acids, carboxylates, and carboxylate esters; a sulfur atom in groups such as thiol groups, alkyl and aryl sulfide groups, sulfoxide groups, sulfone groups, sulfonyl groups, and sulfonamide groups; a nitrogen atom in groups such as amines, hydroxyamines, nitriles, nitro groups, N-oxides, hydrazides, azides, and enamines; and other heteroatoms in various other groups. Non-limiting examples of substituents that can be bonded to a substituted carbon (or other) atom include F, Cl, Br, I, OR, OC(O)N(R)$_2$, CN, NO, NO$_2$, ONO$_2$, azido, CF$_3$, OCF$_3$, R, O (oxo), S (thiono), C(O), S(O), methylenedioxy, ethylenedioxy, N(R)$_2$, SR, SOR, SO$_2$R, SO$_2$N(R)$_2$, SO$_3$R, C(O)R, C(O)C(O)R, C(O)CH$_2$C(O)R, C(S)R, C(O)OR, OC(O)R, C(O)N(R)$_2$, OC(O)N(R)$_2$, C(S)N(R)$_2$, (CH$_2$)$_{0-2}$N(R)C(O)R, (CH$_2$)$_{0-2}$N(R)N(R)$_2$, N(R)N(R)C(O)R, N(R)N(R)C(O)OR, N(R)N(R)CON(R)$_2$, N(R)SO$_2$R, N(R)SO$_2$N(R)$_2$, N(R)C(O)OR, N(R)C(O)R, N(R)C(S)R, N(R)C(O)N(R)$_2$, N(R)C(S)N(R)$_2$, N(COR)COR, N(OR)R, C(=NH)N(R)$_2$, C(O)N(OR)R, and C(=NOR)R, wherein R can be hydrogen or a carbon-based moiety; for example, R can be hydrogen, (C$_1$-C$_{100}$)hydrocarbyl, alkyl, acyl, cycloalkyl, aryl, aralkyl, heterocyclyl, heteroaryl, or heteroarylalkyl; or wherein two R groups bonded to a nitrogen atom or to adjacent nitrogen atoms can together with the nitrogen atom or atoms form a heterocyclyl.

The term "alkyl" as used herein refers to straight chain and branched alkyl groups and cycloalkyl groups having from 1 to 40 carbon atoms, 1 to about 20 carbon atoms, 1 to 12 carbons or, in some embodiments, from 1 to 8 carbon atoms. Examples of straight chain alkyl groups include those with from 1 to 8 carbon atoms such as methyl, ethyl, n-propyl, n-butyl, n-pentyl, n-hexyl, n-heptyl, and n-octyl groups. Examples of branched alkyl groups include, but are not limited to, isopropyl, iso-butyl, sec-butyl, t-butyl, neopentyl, isopentyl, and 2,2-dimethylpropyl groups. As used herein, the term "alkyl" encompasses n-alkyl, isoalkyl, and anteisoalkyl groups as well as other branched chain forms of alkyl. Representative substituted alkyl groups can be substituted one or more times with any of the groups listed herein, for example, amino, hydroxy, cyano, carboxy, nitro, thio, alkoxy, and halogen groups.

The term "radiation" as used herein refers to energetic particles travelling through a medium or space. Examples of radiation are visible light, infra-red light, microwaves, radio waves, very low frequency waves, extremely low frequency waves, thermal radiation (heat), and black-body radiation.

The term "light" as used herein refers to electromagnetic radiation in and near wavelengths visible by the human eye, and includes ultra-violet (UV) light and infra-red light, from about 10 nm to about 300,000 nm wavelength. The term "light" also includes microwave radiation with frequencies from about 300 MHz and about 300 GHz.

The term "UV light" as used herein refers to ultraviolet light, which is electromagnetic radiation with a wavelength of about 10 nm to about 400 nm.

The term "infra-red light" as used herein refers to electromagnetic radiation with a wavelength between about 0.7 micrometers and about 300 micrometers.

The term "solvent" as used herein refers to a liquid that can dissolve a solid, liquid, or gas. Non-limiting examples of solvents are silicones, organic compounds, water, alcohols, ionic liquids, and supercritical fluids.

The term "coating" as used herein refers to a continuous or discontinuous layer of material on the coated surface, wherein the layer of material can penetrate the surface and can fill areas such as pores, wherein the layer of material can have any three-dimensional shape, including a flat or curved plane. In one example, a coating can be formed on one or more surfaces, any of which may be porous or nonporous, by immersion in a bath of coating material.

The term "surface" as used herein refers to a boundary or side of an object, wherein the boundary or side can have any perimeter shape and can have any three-dimensional shape, including flat, curved, or angular, wherein the boundary or side can be continuous or discontinuous.

Methods of Manufacturing a Textured Surface

A method of manufacturing a textured surface is provided. The method includes disposing a template on a substrate; and planarizing the template with a nanoparticulate ink.

The substrate can be a non-conductive and non-reactive substrate, such as glass, quartz, or polymeric resins such as PET sheets or polyimide sheets. In some embodiments, the substrate is an indium tin oxide (ITO) coated glass silicon dioxide.

In some embodiments, the template can be a crosslinked material. The template can be a polymeric resin. For example, the template can be made from a flexible and deformable polymeric material such as polydimethylsiloxane (PDMS), polymethyl methacrylate (PMMA)-crosslinked or uncrosslinked, other monomer UV-resins, polyurethane, or perfluoropolyether (PFPE). The planarizing step can be performed by spin-coating or blade coating the nanoparticulate ink on the template. The template can be deposited on the substrate by casting a mixture containing a PDMS precursor and a curing agent, followed by curing at a temperature above 50° C. Although if light is used to cure, the temperature can be chosen from a temperature below 50° C. The template can have a thickness of 0.01 mm to about 5 mm, or about 0.5 mm to about 4.5 mm, or about 1 mm to about 3 mm. In some embodiments, the template has a thickness of about 0.5 mm, about 1 mm, about 1.5 mm, about 2 mm, about 2.5 mm, about 3 mm, about 3.5 mm, about 4 mm, about 4.5 mm, about 5 mm, or any range or sub-range between these values.

The nanoparticulate ink can be present as a dispersion of nanoparticles in a solvent. The nanoparticulate ink can include nanoparticles including indium tin oxide, a titanium dioxide, an aluminum oxide, a silicon dioxide, a metal oxide, a metal nitride, a metal carbide, a metal oxynitride, a metal oxycarbide, a metal boride, a metal silicide, graphene, graphene oxide, or combinations thereof.

In some embodiments, the nanoparticles have number-averaged and volume-averaged particle sizes of about 1 nm to about 20 nm. In some embodiments, the nanoparticles have number-averaged particle sizes of about 1 nm to about 19 nm, about 2 nm to about 18 nm, about 3 nm to about 17 nm, about 4 nm to about 16 nm, about 5 nm to about 15 nm, about 6 nm to about 14 nm, about 7 nm to about 13 nm, or any sub-range in between.

In some embodiments, the nanoparticles have volume-averaged particle sizes of about 1 nm, about 2 nm, about 3 nm, about 4 nm, about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, or any range or sub-range in between these values. In some embodiments, the nanoparticles are crystalline.

In some embodiments, the dispersion has an alcohol solvent as the liquid phase. In some embodiments, the alcohol is methanol, isopropanol, 1,2-propanediol, or mixtures thereof. In some embodiments, the alcohol can be ethanol, butanol, ethylene glycol, a butane diol (1,2 or 1,3, or 1,4), and mixtures thereof. In some embodiments, the nanoparticulate ink can include a binder component. In some embodiments, the binder component can include a siloxane. The binder can be present in the dispersion as a sol-gel precursor.

Figure 1:
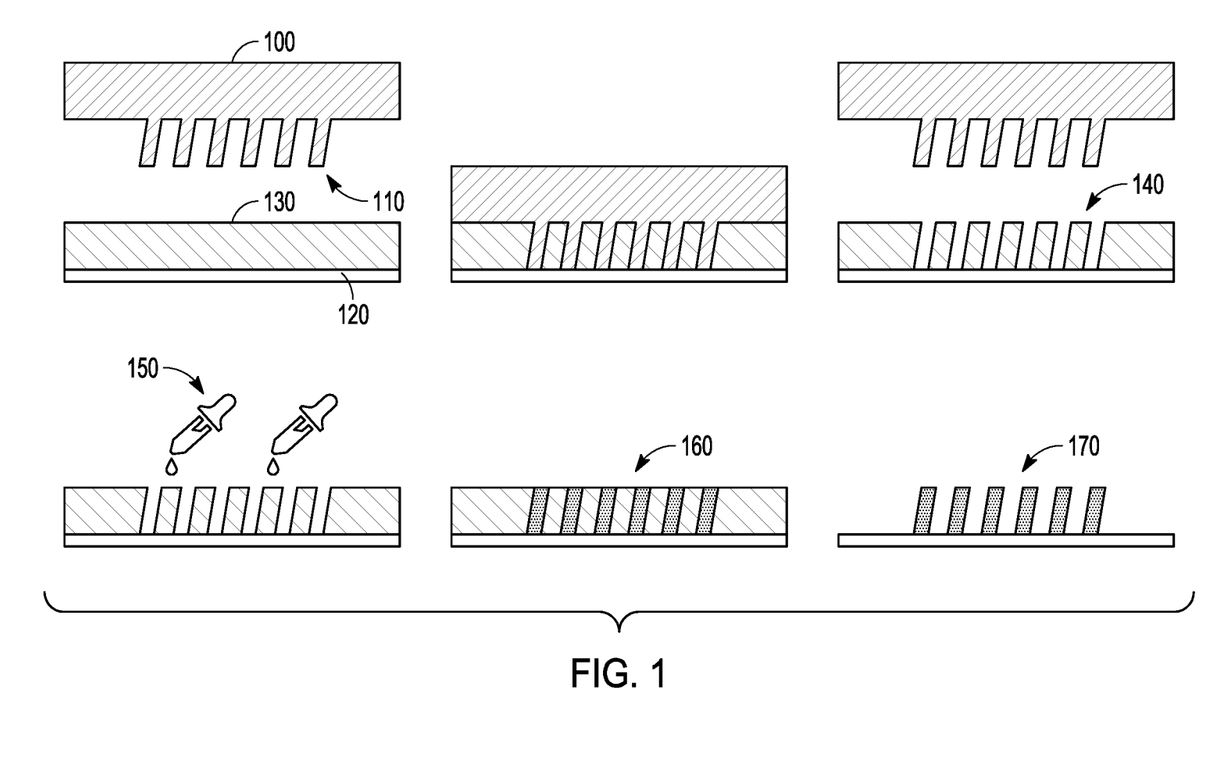
FIG. 1 is a schematic depiction of a method of manufacturing a textured surface, in accordance with various embodiments.

FIG. 1 shows mold (100) having a plurality of features (110), a substrate (120) and a template (130). After imprinting of the template with the mold, imprinted features (140) in the template substantially correspond in shape and position to the features on the mold. The imprinted template can be planarized with nanoparticulate ink (150) to substantially fill the imprinted features with the nanoparticulate ink (160). After removing the template, the substrate contains features (170) composed of nanoparticulate material from the nanoparticulate ink.

In some embodiments, the top surface of template (130) (e.g., the surface that becomes imprinted) can be coated prior to imprinting with a substance that can create a hydrophobic/hydrophilic contrast between the top surface of the template and the imprinted features/cavities. Such a coating can fill the features without leaving a residual layer on the surface of the template.

Figure 2:
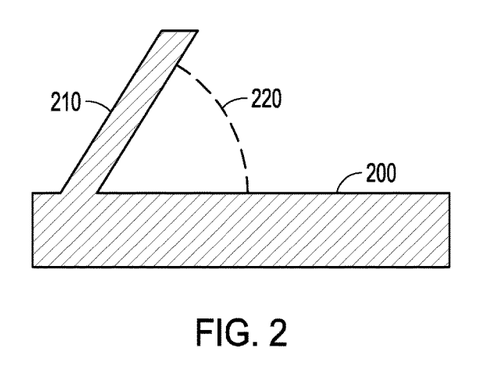
FIG. 2 is a schematic depiction of a feature having an acute angle relative to the surface of a mold, in accordance with various embodiments.

The method can further include imprinting the template with a mold comprising a plurality of features that penetrate the template to form an imprinted template. The mold can be made from, for example, PDMS (polydimethylsiloxane), PUA (polyurethane acrylate), PMMA (poly methyl methacrylate), a hard mold of silicon, nickel, quartz, or $ZrO_2$. Imprinting can be accomplished by hand or with a suitable apparatus such as a Nanonex NX-2000 or NX-2608BA. In some embodiments, the mold has at least one substantially flat surface and at least one of the features has a side that forms an acute angle with the mold. The acute angle can range from about 10 degrees to about 89 degrees, about 20 degrees to about 60 degrees, or less than, equal to, or greater than about 10 degrees, 15, 20, 25, 30, 35, 40, 45, 50, 55, 60, 65, 70, 75, 80, 85, or about 89 degrees. FIG. 2 shows a mold (200) having a feature (210) with an acute angle (220) relative to a flat surface on the mold.

The features can have a height:width aspect ratio from about 2:1 to about 10:1, about 3:1 to 10:1, about 4:1 to about 10:1, about 5:1 to about 10:1 about 6:1 to about 10:1, about 7:1 to about 10:1, about 9:1 to about 10:1, or any range or sub-range between these values. In some embodiments, the features can have a height:width aspect ratio of about 2:1, about 3:1, about 4:1, about 5:1, about 6:1, about 7:1, about 8:1, about 9:1, about 10:1, or any range or sub-range between these values.

The features can have a width:height aspect ratio from about 2:1 to about 10:1, about 3:1 to 10:1, about 4:1 to about 10:1, about 5:1 to about 10:1 about 6:1 to about 10:1, about 7:1 to about 10:1, about 9:1 to about 10:1, or any range or sub-range between these values. In some embodiments, the features can have a width:height aspect ratio of about 2:1, about 3:1, about 4:1, about 5:1, about 6:1, about 7:1, about 8:1, about 9:1, about 10:1, or any range or sub-range between these values.

In some embodiments, the height of a feature can be from about 0.05 microns to about 30 microns, about 0.5 microns to about 25 microns, about 1 micron to about 22 microns, about 2 microns to about 20 microns, about 3 microns to about 18 microns, about 4 microns to about 16 microns, about 5 microns to about 14 microns, about 6 microns to about 12 microns, or any range or sub-range in between these values. The height of a feature can be about 0.05 microns, 1 microns, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, or any range or sub-range in between these values.

In some embodiments, the width of a feature can be from about 0.05 microns to about 30 microns, about 0.5 microns to about 25 microns, about 1 micron to about 22 microns, about 2 microns to about 20 microns, about 3 microns to about 18 microns, about 4 microns to about 16 microns, about 5 microns to about 14 microns, about 6 microns to about 12 microns, or any range or sub-range in between these values. The width of a feature can be about 0.05 microns to about 1 microns, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, or any range or sub-range in between these values.

In some embodiments, the depth of a feature can be from about 0.05 microns to about 30 microns, 0.5 microns to about 25 microns, about 1 micron to about 22 microns, about 2 microns to about 20 microns, about 3 microns to about 18 microns, about 4 microns to about 16 microns, about 5 microns to about 14 microns, about 6 microns to about 12 microns, or any range or sub-range in between these values. The depth of a feature can be about 0.05 microns, 1 micron, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, or any range or sub-range in between these values.

Figure 3:
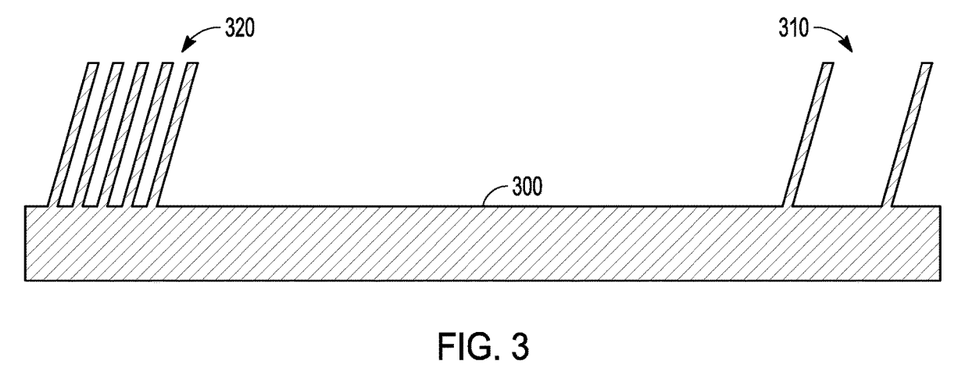
FIG. 3 is a schematic depiction of mold with a portion having a high density of features and a portion having a low density of features, in accordance with various embodiments.

In some embodiments, the features are arranged in a periodic pattern. In some embodiments, the features are randomly arranged. In some embodiments, the features are arranged in a non-periodic pattern. In some embodiments, the features on the mold can be arranged such that portions of the mold have a high areal density of features spaced closely together and another portion of the mold with a pattern that does not contain any features or contains relatively few features that are spaced far apart relative to the feature size. FIG. 3 illustrates a portion of the mold (300) with a high density of features (320) spaced closely together and a portion of the mold that has relatively few features (310) that are spaced far apart relative to the feature size.

In some embodiments, the separation between any two features can be from about 0.05 microns to about 1000 microns, about 5 microns to about 900 microns, about 10 microns to about 800 microns, about 20 microns to about 700 microns, about 50 microns to about 600 microns, about 75 microns to about 500 microns, about 100 microns to about 400 microns, or any range or sub-range in between these values.

The separation between any two features can be about 0.05 microns, about 1 micron, about 5 microns, about 10 microns, about 15 microns, about 25 microns, about 35 microns, about 45 microns, about 55 microns, about 65 microns, about 75 microns, about 85 microns, about 95 microns, about 105 microns, about 115 microns, about 125 microns, about 135 microns, about 145 microns, about 155 microns, about 165 microns, about 175 microns, about 185 microns, about 195 microns, about 205 microns, about 215 microns, about 225 microns, about 235 microns, about 245 microns, about 255 microns, about 265 microns, about 275 microns, about 285 microns, about 295 microns, about 305 microns, about 315 microns, about 325 microns, about 335 microns, about 345 microns, about 355 microns, about 365 microns, about 375 microns, about 385 microns, about 395 microns, about 405 microns, about 415 microns, about 425 microns, about 435 microns, about 445 microns, about 455 microns, about 465 microns, about 475 microns, about 485 microns, about 495 microns, or any range or sub-range between these values.

In some embodiments, the imprinting comprises residual-free imprint lithography. Residual free imprinting can be based on adjusting surface energies/tensions of template, substrate, inks, and adjusting ink concentration and coating speed In some embodiments, the imprinting creates imprinted features in the template substantially corresponding in shape and position to the features on the mold. Thus, the imprinting can create negative features in the template that correspond to the size and positions of the features on the mold. Planarizing a template with imprinted features can be accomplished by spin coating the nanoparticulate ink so that it substantially fills the imprinted features in the template.

The method can further include a first annealing of the imprinted template. The first annealing can include heating, microwave irradiation, visible light irradiation, infra-red irradiation, and ultraviolet irradiation. In embodiments in which electromagnetic radiation is used in annealing the light source can be constant or the electromagnetic radiation can be deployed through a pulsed light source that delivers intense pulses of light. In some embodiments, the annealing includes heating at temperatures of up to 100° C., 200° C., 300° C., 400° C., 500° C., 600° C., 700° C., 800° C., 900° C., or 1000° C., or any range or sub-range in between. In some embodiments, the annealing is conducted at temperatures of 100 to 500° C. for a period of 5 minutes to 2 hours. In some embodiments, the annealing is conducted at temperatures between 100° C. to 1000° C. for a period of 5, 10, 15, 20, 25, 30, 40, 50, 60, 70, 80, 90, 100, 110, or 120 minutes, or any range or sub-range in between these values.

In some embodiments, the method includes removing the template or imprinted template from the substrate. Removing the template or imprinted template can include dissolution, calcination, or irradiation with microwave irradiation, visible light, infra-red radiation, or ultraviolet radiation. Once the template or imprinted template is removed, features corresponding to the size and position of the features on the mold made from cured or annealed nanoparticulate ink are revealed.

A second annealing of the substrate and nanoparticulate ink features can be performed under the conditions set forth herein. In some embodiments, the first annealing dries/fuses the particles in the template. In some embodiments, the second annealing promotes binding and adhesion to the substrate and between the nanoparticles.

In some embodiments, a method of manufacturing a textured surface is provided. The method includes disposing a template on a substrate, imprinting the template with a mold comprising a plurality of features that penetrate the template to form an imprinted template, planarizing the imprinted template with a nanoparticulate ink, annealing the nanoparticulate ink, removing the imprinted template. In the method, the imprinting creates imprinted features in the template substantially corresponding in shape and position to the features on the mold, the nanoparticulate ink substantially fills the imprinted features in the template, and the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof Methods of Manufacturing a Textured Surface Using a Transfer Print Master Methods of manufacturing a textured surface using a transfer print master shares many similarities with the method described herein. Any of the materials, methods, and techniques used above can be used in the following manufacturing method as well.

In some embodiments, a method of manufacturing a textured surface is provided. The method includes planarizing an imprinted template with a nanoparticulate ink to form a transfer print master and contacting the transfer print master with a substrate. The composition of the nanoparticulate ink and the substrate can be as set forth herein. The transfer print master can have any composition that is suitable for the template or imprinted template as set forth herein.

In some embodiments, the contacting comprises a sheet-based or roll-to-roll transfer process. The method can further include disposing a template on a first substrate, imprinting the template with a mold with a plurality of features that penetrate the template to form an imprinted template. In some embodiments, the method further includes removing the transfer print master to provide a plurality of features disposed on the second substrate. Removing of the transfer print master can be accomplished by, for example, include dissolution, calcination, or irradiation with microwave irradiation, visible light, infra-red radiation, or ultraviolet radiation. In some cases the light may be pulsed.

In some embodiments, the surface of the template comprises a hard coat. The hard coat can include silicas, perfluoropolyethers, fluoro-containing acrylates, epoxides, fluoro-modified silica materials, or mixtures of thereof.

In some embodiments, the imprinted template comprises a crosslinked material. In some embodiments, the template comprises a polymeric resin. The template can comprise any of the materials described herein. Thus, the imprinting can create a negative feature in the template that corresponds to the size and positions of the features on the mold. Planarizing a template with imprinted features can be accomplished by spin coating the nanoparticulate ink so that it substantially fills the imprinted features in the template.

In some embodiments, the imprinting includes residual-free imprint lithography. The imprinting, with or without residual-free imprint lithography, can create imprinted features in the imprinted template substantially corresponding in shape and position to the features on the mold. In some embodiments, the nanoparticulate ink substantially fills the imprinted features in the imprinted template. The nanoparticulate ink can include an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

The size, shape, and spacing of the features can be as already set forth herein. In some embodiments, the method further includes annealing the substrate. The annealing can be performed using any of the methods and conditions already set forth herein. In some embodiments, the annealing includes heating, microwave irradiation, visible light irradiation, infra-red irradiation, and ultraviolet irradiation.

Figure 4:
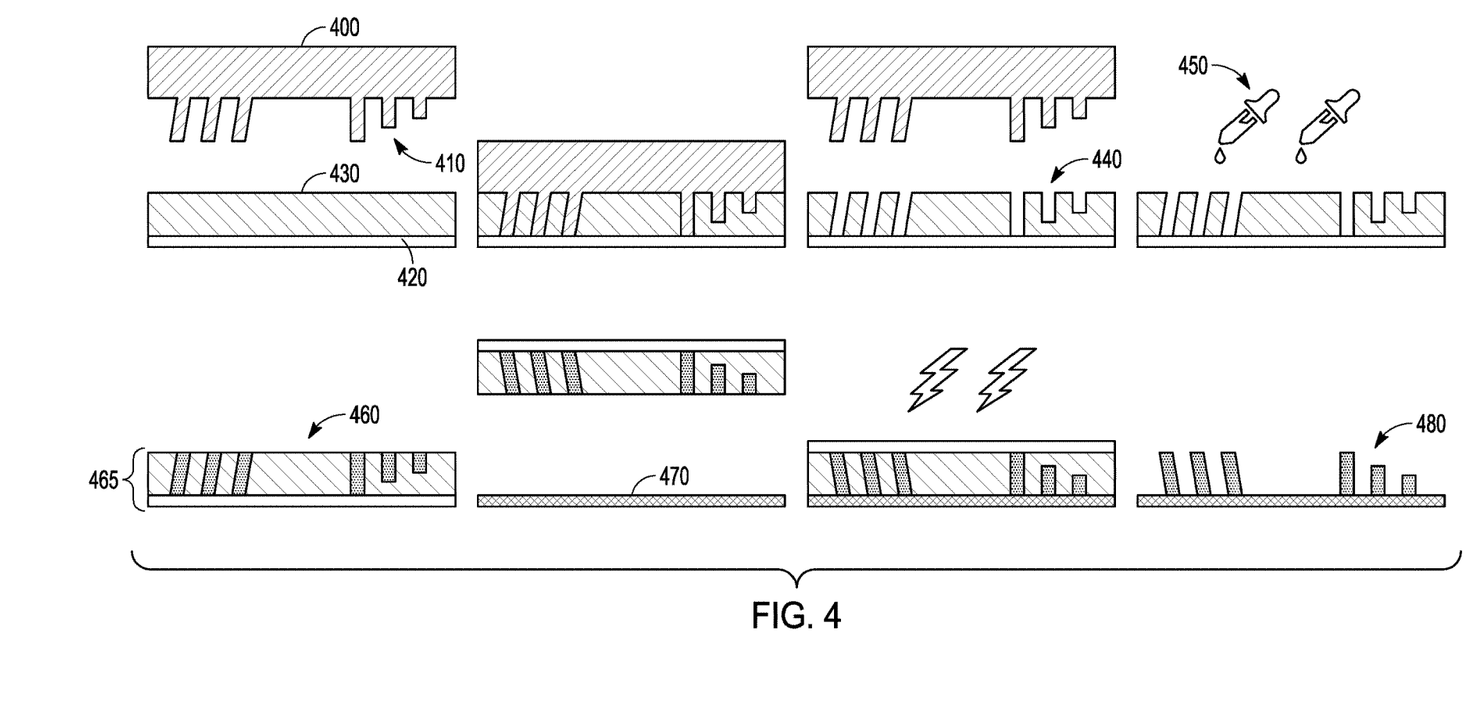
FIG. 4 is a schematic depiction of a method of manufacturing a textured surface using a transfer print master, in accordance with various embodiments.

FIG. 4 shows mold (400) having a plurality of features (410), a substrate (420) and a template (430). After imprinting of the template with the mold, imprinted features (440) in the template substantially correspond in shape and position to the features on the mold. The imprinted template can be planarized with nanoparticulate ink (450) to substantially fill the imprinted features with the nanoparticulate ink (460) and to form the transfer print master (465). The transfer print master can contact second substrate (470), and after removing of the transfer print master, the second substrate has features (480) disposed on it composed of nanoparticulate material from the nanoparticulate ink.

In some embodiments, the transfer print master (465) and the nanoparticulate ink (460) are annealed prior to contacting the second substrate (470). The template can comprise a material that is transparent to the irradiation used to heat, anneal the structure, or both, without substantially heating the transfer print master.

An article of manufacture that includes a textured surface can be formed by any of the methods set forth herein. Examples of articles that can be made using the methods described herein include, without limitation, a lens, a flat lens, a meta lens, a display, a flexible display, a touch panel, a sensor surface, a shielding foil, and blaze gratings. The article can optionally be optically transparent. For example, the article can be optically transparent to electromagnetic radiation having a wavelength through the visible and near infra-red spectrum (e.g., in a range of from about 400 nm to about 1400 nm. The article can be, or can be a component, of a device such as a virtual reality device or an augmented reality device. For example, the article can be a component of a virtual reality or augmented reality lens, glasses, or goggles.

In some embodiments, a method of manufacturing a textured surface, is provided. The method includes disposing a template on a first substrate, imprinting the template with a mold comprising a plurality of features that penetrate the template to form an imprinted template, planarizing the imprinted template with a nanoparticulate ink to form a transfer print master, annealing the nanoparticulate ink, contacting the transfer print master with a second substrate, and removing the transfer print master to provide a plurality of features disposed on the second substrate. In the method, the imprinting creates imprinted features in the template substantially corresponding in shape and position to the features on the mold, the nanoparticulate ink substantially fills the imprinted features in the template, and the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

The features deposited using the methods described herein can result in structures that contain residual nanoporosity. Such porosity exists in films coated on a surface from the nanoparticle based ink, in features that are directly printed onto a substrate and also in features prepared within a master for subsequent transfer to a substrate or recovery of isolated structures.

Moreover, such porosity can result when using inks containing only nanoparticle dispersions and also in inks containing both nanoparticles and sol-gel type precursors that yield a desired product or binder that is incorporated into the features or other binder materials. In some cases, such residual porosity is desirable, e.g., for ion transport through a sensor or battery electrode. In other cases, residual porosity is deleterious in terms of structure properties, performance mechanical stability, shrinkage, or both, during calcination.

Reducing the residual porosity (densification) can tune material properties including refractive index, conductivity, etc. and improving mechanical stability. Such densification arises by conduction reactions and or/depositions within the residual pores of the features described herein to modify properties. In some embodiments, the deposition includes the use of chemical vapor deposition (CVD) to deposit materials within the pores of the features described herein with a controlled amount, composition, thickness, or any combination of these properties.

In some embodiments, the deposition includes the use of atomic layer deposition (ALD) to deposit materials within the pores of the features described herein with a controlled amount, composition, thickness, or any combination of these properties. In some embodiments, the CVD or ALD depositions can deposit materials of substantially the same composition as the porous features or compositions that differ from the porous features. The ALD process can enhance mechanical stability of the printed patterns and to the structures created within the mold prior to transfer or mold removal, which can enable easier pattern transfer.

In some embodiments, ALD, CVD, or both can be used to apply an adhesion layer (of the same or different composition as the composition of the features to be patterned) to the structure to be transferred. In some embodiments, ALD, CVD, or both can also be used to enhance adhesion of the features described herein to the substrate. In some embodiments, ALD, CVD, or both can be used to reduce the surface roughness of the features described herein.

The ALD process described herein can be applied to structures made by conventional NIL (nanoimprint lithography) printing with metal oxide inks. The structures made by the NIL printing process laid out in Kothari, R; Beaulieu, M R; Hendricks, N R; Li, S K; Watkins, J J, *Chemistry of Materials Volume:* 29 Issue: 9 Pages: 3908-3918 can be treated with the ALD process described herein.

In ALD, a surface or substrate is exposed, sequentially, to a first reactant and a second reactant. The first and second reactants are deposited in a non-overlapping way. In ALD, the deposition of a reactive substance, such as a first reactant, on a surface is limited by the amount of reactive sites on the surface. Once all of the reactive sites have been consumed, no further reaction (e.g., growth in layer thickness or filling of pores) can occur until additional reactive substance is added. Any remaining first reactant molecules can be flushed away prior to addition and deposition of a second reactant. Thus, after deposition of a first reactant, the second reactant is deposited. A single ALD cycle includes depositing a first reactant, optionally flushing any excess first reactant, depositing a second reactant deposition, and optionally flushing any excess second reactant. Successive cycles of this process can result in fine control of the thickness of the deposited layer or the amount of porosity reduced.

The depositions can be carried out to impart various reductions in porosity ranging from thin surface coatings of the pores to substantially filling the pores. Such depositions can be conducted within films coated from the nanoparticle base ink, within free-standing printed features, or within nanoparticle compositions contained within the features of a master mold. Such depositions can be conducted before or after calcination (curing or annealing) of coated or printed films and features.

In some embodiments, a spatial ALD process can be used. In spatial ALD, the reagents (first reactant and second reactant) are separated spatially by an inert gas and the substrate can be moved relative to the ALD head or the ALD head is moved relative to the substrate. Spatial ALD can be used for roll-to-roll processing of the features.

In some embodiments, a method of manufacturing a textured surfaces includes performing at least one cycle of atomic layer deposition (ALD) on the imprinted features, wherein the ALD comprises depositing a first reactant and a second reactant, wherein the first reactant comprises $MX_y$, $MR_y$, $M(NR)_y$, $M(OR)_y$, $MX_yR_z$, $MX_y(NR)_z$, $MX_y(OR)_z$, $MCp_2$, or combinations thereof and the second reactant comprises water or oxygen. Each y and z is independently an integer from 2 to 8. Each X is independently F, Cl, Br, or I. Each R is independently hydrogen or a substituted or unsubstituted $C_{1-20}$ alkyl, and Cp is a substituted or unsubstituted cyclopentadienyl.

Suitable metals can include Al, Ti, Si, Cu, Pd, Ni, Ru, Ta, Zr, Zn, In, Hf, Sn, Pt, and combinations thereof. In some embodiments, the metal is Ti. In some embodiments, the first reactant is tetrakis(dimethylamino)titanium (TDMAT), with the following structure:

Suitable second reactants include water, oxygen, and ozone. In some embodiments, the second reactant is water. The second reactant reacts with the first reactant on the surface, in the pores, or both, of the one or more features. For example, reaction of TDMAT with water produces $TiO_2$ on the one or more features, the pores, or both, of the one or more features. The ALD can be conducted at a temperature of about 100° C. to about 800° C., about 200 to 800° C., 200 to 700° C., 200 to 600° C., 200 to 500° C., 200 to 400° C., or 200 to 300° C. In some embodiments, the ALD is can be conducted at a temperature of about 100° C., about 200° C., 250° C., 300° C., 350° C., 400° C., 450° C., 500° C., 550° C., 600° C., 650° C., 700° C., 750° C., 800° C., or any range between these values. In some embodiments, the ALD is conducted at a temperature of 250° C.

The thickness of the deposited material after each ALD cycle can be about 0.01 Å to 1.0 Å, 0.05 Å to 1.0 Å, 0.1 Å to 0.9 Å, 0.1 Å to 0.8 Å, 0.1 Å to 0.7 Å, 0.2 Å to 0.7 Å, 0.2 Å to 0.6 Å, or any range or sub-range between these values. In some embodiments, the thickness of the deposited material after each ALD cycle can be 0.01 Å, 0.05 Å, 0.2 Å, 0.3 Å, 0.4 Å, 0.5 Å, 0.6 Å, 0.7 Å, 0.8 Å, 0.9 Å, 1.0 Å, or any range between these values. The number of ALD cycles used can be about from about 1 to 5000 cycles, 1 to 4000 cycles, 1 to 3000 cycles, 1 to 2000 cycles, 1 to 1000 cycles, 1 to 500 cycles, 1 to 400 cycles, 1 to 300 cycles, 1 to 200 cycles, 1 to 100 cycles, 1 to 90 cycles, 1 to 80 cycles, 1 to 70 cycles, 1 to 60 cycles, 1 to 50 cycles, 1 to 40 cycles, 1 to 30 cycles, 1 to 20 cycles, or any range between these values. In some embodiments, the number of ALD cycles can be 1, 2, 3, 4, 5, 6, 7, 8, 9, 10, 15, 20, 25, 30, 35, 40, 45, 50, 55, 60, 65, 70, 75, 80, 85, 90, 100, 110, 120, 130, 140, 150, 160, 170, 180, 190, 200, 220, 240, 260, 280, 300, 320, 340, 360, 380, 400, 420, 440, 460, 480, 500, or any range or sub-range between these values.

After deposition of the desired material with ALD on the textured surface is complete, the textured surface can be heated at a temperature of about 200° C. to 1000° C., 200° C. to 900° C., 200° C. to 800° C., 200° C. to 700° C., 200° C. to 600° C., 200° C. to 500° C., 400° C. to 800° C., or any range between these values. In some embodiments, after deposition of the desired material with ALD on the textured surface, the textured surface can be heated at a temperature of about 200° C., 250° C., 300° C., 350° C., 400° C., 450° C., 500° C., 550° C., 600° C., 650° C., 700° C., 750° C., 800° C., 850° C., 900° C., 950° C., 1000° C., or any range or sub-range between these values. The heating can be performed for about 1 to 12 hours, 1 to 11 hours, 1 to 10 hours, 1 to 9 hours, 1 to 8 hours, 1 to 7 hours, 1 to 6 hours, 1 to 5 hours, 1 to 4 hours, 1 to 3 hours, 1 to 2 hours, 2 to 6 hours, 3 to 5 hours, or any range between these values. In some embodiments, the heating can be performed for about 1 hour, 2 hours, 3 hours, 4 hours, 5 hours, 6 hours, 7 hours, 8 hours, 9 hours, 10 hours, 11 hours, 12 hours, or any range or sub-range between these values.

In some embodiments, after ALD treatment, a feature can exhibit shrinkage from about 1% to 15%, 1% to 4%, 1% to 13%, 1% to 12%, 1% to 11%, 1% to 10%, 1% to 9%, 1% to 8%, 1% to 7%, 1% to 6%, 1% to 5%, 1% to 4%, or 1% to 3%. In some embodiments, after ALD treatment, a feature can exhibit shrinkage from 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, or any range or sub-range between these values. In some embodiments, following ALD treatment the structure can be annealed through exposure to electromagnetic radiation. The electromagnetic radiation can be delivered through microwave irradiation, visible light irradiation, infra-red irradiation, and ultraviolet irradiation. In embodiments in which electromagnetic radiation is used in annealing the light source can be constant or the electromagnetic radiation can be deployed through a pulsed light source that delivers intense pulses of light.

In some embodiments, after ALD treatment, a feature can exhibit a refractive index of from about 1.2 to 4.0, 1.2 to 3.8, 1.2 to 3.6, 1.2 to 3.4, 1.2 to 3.2, 1.2 to 3.0, 1.2 to 2.8, 1.2 to 2.6, 1.2 to 2.4, 1.2 to 2.2, 1.2 to 2.0, 1.2 to 1.8, 1.2 to 1.6, 1.2 to 1.4, or any range or sub range in between these values. In some embodiments, after ALD treatment, a feature can exhibit a refractive index of about 1.0, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, 4.0, or any range or sub-range in between these values. In some embodiments, it is possible to use ALD to create a gradient of refractive index values. The gradient can result from forming a shell of ALD deposited material on or around the formed features.

In some embodiments, the ALD treatment described herein can fill the pores in the features described herein and minimizes shrinkage in the printed or transferred features during post processing, annealing, or both. In some embodiments, the ALD fills pores in the features with $TiO_2$. In some embodiments, the features have a shrinkage of about 1 to 15% after the features are heated at a temperature of about 200° C. to 1000° C. or the features are exposed to light. In some embodiments, the features have a refractive index of about 1.2 to 4.0 after the features are heated at a temperature of about 200° C. to 1000° C. or the features are exposed to light.

In filling pores with ALD, the refractive index of the article can be adjusted or tuned. In some embodiments, tuning or adjustment using ALD can be used to correct errors in manufacturing e.g., bringing the refractive index to a desired value not present in the formed article.

However, an ALD process can also be used to tune the refractive index value in an article that is intentionally formed to have a refractive index value that is below a predetermined and desirable refractive index. Imprinting alone may not provide the accuracy in achieving a predetermined refractive index value. However, a precise predetermined refractive index value may be achieved by using imprinting to achieve an article with a refractive index value that is within about 10% of the predetermined refractive index value, or about 9%, 8%, 7%, or about 6%. ALD can then be used to fine tune the refractive index value to be within about 5%, 4%, 3%, 2%, 1%, 0.5%, 0.05%, or about 0.01% of the predetermined value or at the predetermined value.

ALD can fine tune the refractive index of the article by reducing the porosity of the article. In some embodiments, the porosity can result from unintentionally created porosity formed during the imprinting process. In other embodiments, porosity in the article can be intentionally induced in the article, for example, the nanoparticles can be functionalized with an organic ligand, which induces porosity in the article. Porosity can further be tuned by controlling the particle size distribution of the nanoparticles in the ink, spin coating time, or through the selection and use of binders. ALD can be used to fill the intentionally created pores to tune the refractive index.

EXAMPLES

Various embodiments of the present invention can be better understood by reference to the following Examples which are offered by way of illustration. The present invention is not limited to the Examples given herein.

Example 1

Deposition of $TiO_2$ on a Nanoparticulate Ink Film

The film as prepared by spin coating from the NP-based ink exhibits a refractive index (RI) of 1.82. The NP-based ink contained 1,2-propanediol, methanol, isopropanol, and titanium diisopropoxide bis(acetylacetonate). After heating to 250° C. the film exhibits a refractive index of approximately 1.86. After 25 deposition cycles the film exhibits a RI of 2.25. Lateral shrinkage of $TiO_2$ films coated from the $TiO_2$ NP ink and $TiO_2$ coated films prepared using the NP based ink followed by deposition of $TiO_2$ within the pores by ALD were compared after heating to 475° C. for 4 hours. The films without ALD treatment exhibited a shrinkage of 18.8% whereas the films treated with ALD for 25 cycles and for 150 cycles exhibited shrinkages of 6.8 and 3.7% respectively. Porosity can be calculated from refractive index. Films without ALD treatment exhibited positions of 31.1% and 28.1% before and after heating to 475° C. for 4 hours respectively whereas films subject to 25 cycles of ALD exhibited porosities of 9.0% and 6.9% before and after heating to 475° C. for 4 hours respectively.

Deposition of materials with a lower inherent RI, such and $SiO_2$, could be deposited into the pores to reduce porosity with smaller increases in RI relative to that achieved with $TiO_2$. Using materials such as $SiO_2$ provides another method of tuning the RI value.

TABLE 1

Expected layer thickness as a function of number of ALD cycles for the deposition of $TiO_2$ on a nanoparticulate ink film.

| ALD Temperature, °C. | # of ALD cycles | Expected layer thickness, nm |
|---|---|---|
| 250 | 380 | 15 |
| 250 | 150 | 6 |
| 250 | 50 | 2 |
| 250 | 25 | 1 |

A comparison of the refractive index of substrates, with and without ALD of $TiO_2$ was examined where ALD was performed at 250° C. on bare Si and spin coated $TiO_2$ nanoparticle films. Unexpectedly, the refractive index significantly increased, from 1.82 to 2.25, with a 1.4 nm-thick layer ALD of $TiO_2$. The numeric data associated the experiment is shown in Table 2. The literature value of refractive index of anatase is 2.488.

TABLE 2

Comparison of the Refractive Index ($n_D$) as function of number of ALD cycles, with and without ALD of $TiO_2$.

| | Bare Si | | $TiO_2$ NP | |
|---|---|---|---|---|
| # ALD Cycles | $n_D$ | d, nm | $n_D$ | d, nm |
| 0 | 1.82 | 48 | | |
| 0 (250° C.) | 1.86 | 44 | | |
| 25 | 2.32 | 1.4 | 2.25 | 44 |
| 50 | 2.40 | 2.3 | 2.27 | 46 |
| 150 | 2.46 | 6 | 2.26 | 54 |
| 380 | 2.50 | 15 | 2.26 | 72 |

Tables 3 and 4 show the data associated with the change in refractive index percent of a substrate after ALD of $TiO_2$.

TABLE 3

Comparison of the Refractive Index ($n_D$) as function of number of ALD cycles, with and without ALD of $TiO_2$ after 4 hours of treating the sample at 475° C.

| # ALD Cycles | Bare Si | | | | $TiO_2$ NP | | | |
|---|---|---|---|---|---|---|---|---|
| | $n_D$ | $n_{D2}$ | d, nm | $d_2$, nm | $n_D$ | $n_{D2}$ | d, nm | $d_2$, nm |
| 0 | 1.82 | 1.87 | 48 | 39 | | | | |
| 0 (250° C.) | 1.86 | | 44 | | | | | |
| 25 | 2.32 | | 1.4 | | 2.25 | 2.30 | 44 | 41 |
| 50 | 2.40 | | 2.3 | | 2.27 | 2.31 | 46 | 43 |
| 150 | 2.46 | | 6 | | 2.26 | 2.30 | 54 | 52 |
| 380 | 2.50 | 2.48 | 15 | 15 | 2.26 | 2.30 | 72 | 70 |

TABLE 4

Comparison of the Percent Shrinkage as function of number of ALD cycles, with and without ALD of $TiO_2$ after 4 hours of treating the sample at 475° C.

| Sample | Shrinkage, % |
|---|---|
| 0 cycles on $TiO_2$ NP | 18.8 |
| 25 cycles on $TiO_2$ NP | 6.8 |
| 50 cycles on $TiO_2$ NP | 6.5 |
| 150 cycles on $TiO_2$ NP | 3.7 |
| 380 cycles on $TiO_2$ NP | 2.8 |
| 380 cycles on Si | 0 |

The ALD treatment can reduce the porosity of nanoparticulate ink films or features described herein. The Lorentz-Lorenz equation can estimate porosity using refractive index values of pores, bulk material, and film. Porosity (air voids) decrease a film's refractive index ($n_{air}=1$). Although all films possess some amount of residual porosity, the ALD-treated films and features as described herein possess much less porosity. Heat treatment results in smaller changes in porosity for ALD-treated samples compared to NP-only (nanoparticulate) samples.

TABLE 5

Comparison of the change in porosity as a function of ALD cycles. Samples were heated to 475° C. and held at that temperature for 4 hours.

| | Shrinkage, % | |
|---|---|---|
| # of ALD Cycles | Before Heating | After Heating |
| 0 | 31.1 | 28.1 |
| 25 | 9.0 | 6.9 |
| 50 | 8.1 | 6.5 |
| 150 | 8.5 | 6.9 |
| 380 | 8.5 | 6.9 |

Example 2

Materials.

20 wt % $TiO_2$ NPs in 1,2-propanediol were purchased from US Research Nanomaterials Inc. $TiO_2$ precursor, tetrakis(dimethylamino)titanium (TDMAT), and aluminum oxide ($Al_2O_3$) precursor, trimethylaluminum (TMA), were purchased from Cambridge NanoTech. Titanium diisopropoxide bis(acetylacetonate), 75% in isopropanol, and photoinitiator 2,2-dimethoxy-2-phenylacetophenone (DMPA), 99% was purchased from Sigma Aldrich. Sylgard 184 (polydimethyl siloxane, PDMS) was purchased from Ellsworth Adhesives. (7.0-8.0% vinylmethylsiloxane)-dimethylsiloxane copolymer, trimethylsiloxy terminated (VS), platinum-divinyltetramethyldisiloxane complex in xylene (Pt-DVS), and (25-30% methylhydrosiloxane)-dimethylsiloxane copolymer, hydride terminated (MCP) were purchased from Gelest. 2,4,5,8-tetramethyl-2,4,6,8-tetravinyl-cyclotetrasiloxane (TCS) was purchased from Fluka. Norland Optical Adhesive 60 (NOA60) was purchased from Norland Products Inc. Methanol and isopropanol were purchased from Fischer Scientific. Perfluorinated diacrylate, Fluorolink MD700 was purchased from Cornerstone Technology, LLC. ST505 PET web was purchased from Tekra. Silicon substrates were purchased from Nova Electronics. Quartz substrates were purchased from ChemGlass. All materials were used without further purification.

Methods.

Nanoparticle dispersions were prepared by diluting the stock $TiO_2$ nanoparticles from 20 wt % to between 2.5 and 10 wt % using methanol. The dispersions were then sonicated for 5 minutes. After sonication, 10% titanium diisopropoxide bis(acetylacetonate) or tetraethylorthosilicate (TEOS) was added to the dispersions (10% solids with respect to the mass of $TiO_2$ NPs), and the dispersions were sonicated again for 5 minutes.

Before preparing planar or patterned films, the silicon substrates were subjected to 5 minutes of oxygen plasma to activate the surface. Planar films were spin coated at 3000 rpm until all the solvent was removed. Patterned structures were prepared. Briefly, stamps were prepared by pouring PDMS prepolymer onto fluorinated silicon wafers containing various nanopatterns. After curing, the PDMS stamps are easily removed and can be used and reused in solvent-assisted NIL. The diluted $TiO_2$ dispersions were spin coated at 3000 rpm under 5% RH for 5-30 seconds and then a PDMS stamp was placed carefully on top of the film. After several minutes on a 50° C. hotplate, the PDMS stamp was removed, revealing imprinted $TiO_2$.

For high aspect ratio (HAR) pillars, a modified approach was taken. Fluorinated silicon masters containing HAR vias were spin coated with Fluorolink MD700 prepolymer containing 2% DMPA (with respect to prepolymer weight) and then placed face-down onto a cured NOA60-coated piece of PET. The entire assembly was placed in a Nanonex imprinting tool (NX-2600BA), pumped down for 2 minutes, and then imprinted and UV-cured at 10 psi for 15 minutes. After separation, the fluoropolymer replica mold containing pillars was adhered to a Si wafer with a layer of NOA60 using the Nanonex to ensure a flat, smooth surface. For these HAR patterns, composite PDMS stamps were prepared in order to improve transfer of the HAR features. The fabrication of composite stamps briefly includes mixing VS, TCS, Pt-DVS, and MCP in appropriate amounts, spin coating a layer onto the replica master, curing on a hotplate, and then backing with Sylgard 184. After curing, the HPDMS stamps were used to imprint the $TiO_2$ NP-based ink. The imprinted HAR pillar features were subjected to NIR irradiation (Adphos 126-125 NIR dryer) through the stamp before separation.

Films and structures were subjected to various numbers of deposition cycles in a Cambridge NanoTech Savannah 90 Atomic Layer Deposition system. All depositions were carried out at 250° C. unless otherwise specified. The $TiO_2$ deposition recipe followed consisted of a 0.1 s TDMAT pulse followed by a 0.015 s $H_2O$ pulse, with an expected growth rate of approximately 0.4 Å/cycle. $Al_2O_3$ depositions were carried out similarly, with a 0.015 s $H_2O$ pulse followed by a 0.015 s TMA pulse, corresponding to a growth rate of approximately 1 Å/cycle.

Characterization.

Refractive index and film thicknesses of planar films were measured by variable angle spectroscopic ellipsometry on a JA Woollam RC2 ellipsometer, as well as transmission and reflection intensity. Ellipsometric data was modeled using the Cauchy model for the transparent region of $TiO_2$, and the b-spline model with Kramers-Kronig consistency was used to include the absorbing region (UV).

Top-down and cross-sectional films and nanostructures were analyzed by scanning electron microscopy using a FEI Magellan 400 FESEM. Surface roughness was measured using an atomic force microscope (Veeco Dimension 3100). Composition as a function of film depth was characterized by X-ray photoelectron spectroscopy (XPS) using a Quantum 2000 Scanning ESCA microprobe (Physical Electronics, Inc.) with Al-Kα radiation (1486.6 eV).

ALD onto Planar Films

Both NP-based films and nanostructures were densified using ALD. Nanostructures and thin films were prepared by spin coating a NP dispersion onto a Si substrate and either imprinted or allowed to fully dry before ALD. For each ALD treatment, samples were deposited onto NP-based films as well as onto bare silicon, for reference.

Table 6 shows the expected thicknesses for the different depositions onto bare Si, which were calculated according to the growth rate of 0.4 Å/cycle provided by Cambridge NanoTech. Both the measured refractive indices and thicknesses match well with the expected results. The decrease in refractive index with number of cycles is expected and is due to discontinuous film formation with only a few deposition cycles. The NP films were characterized before and after each ALD treatment.

TABLE 6

$TiO_2$ Deposition onto Bare Si

| # of cycles | Expected thickness, nm | Measured thickness on bare Si, nm | Measured refractive index on bare Si |
|---|---|---|---|
| 380 | 15 | 15 | 2.5 |
| 150 | 6 | 6 | 2.46 |
| 50 | 2 | 2.3 | 2.40 |
| 25 | 1 | 1.4 | 2.32 |

The thickness and refractive index of planar $TiO_2$ NP films were measured after spin coating and after a 250° C. heat treatment as controls since the deposition takes place at 250° C. The refractive index of the as-spun film increases from 1.82 to 1.86, and the film thickness decreases from 48 to 44 nm after a 2-hour 250° C. heat treatment. These slight changes can be attributed to a mild densification of the NP film. To determine the effect of ALD onto $TiO_2$ NP films, we prepared several thin films from our NP dispersions and subjected them to various numbers of ALD cycles.

After 380 ALD cycles the measured total film thickness is 72 nm and the refractive index is 2.26, however after just 25 cycles, there is a negligible change in film thickness accompanied by an approximately 24% increase in refractive index. The full refractive index as a function of wavelength for 50 cycles of ALD emphasizes the dramatic, near-bulk values that can be achieved by a short ALD process step. The results imply that the intrinsic porosity of the NP films is being decreased by ALD, which can also be observed from the change in film surface morphology with increasing ALD cycles. Using the Lorentz-Lorenz equation, the porosity of the NP films was calculated after spin after 0, 25, 50, 150, and 380 ALD cycles before and after a 4-hour 475° C. heat treatment, as shown in Table 7.

TABLE 7

Porosity Calculated from Lorentz-Lorenz Equation.

| | Porosity, % | |
|---|---|---|
| # ALD cycles | Before heating | After heating |
| 0 | 31.1 | 28.1 |
| 25 | 9.0 | 6.9 |
| 50 | 8.1 | 6.5 |
| 150 | 8.5 | 6.9 |
| 380 | 8.5 | 6.9 |

The NP films with no ALD treatment resulted in about 30% porosity, which is the cause for the relatively low refractive index value of 1.82 (compared to $n_D$=2.488 of bulk $TiO_2$). After heating, the porosity of the untreated sample decreases, but remains close to 30%. However, after 50 ALD cycles onto the NP films, a dramatic decrease in the porosity by over 20% was observed, corresponding to an increased refractive index. Additionally, after heating this sample, the porosity decreases by just 1.6%, compared to 3% for the untreated sample. These results suggest that 25 to 50 cycles of ALD is an effective method to decrease film porosity, leading to enhanced refractive index values for our films. The decrease in void volume, or porosity, leads favorably to a decrease in shrinkage upon heating. Additionally, the surface roughness (rms) of the NP films before ALD was 2.1±0.1 nm and did not change significantly after ALD, which is an important consideration for optical applications as undesired scattering will be detrimental to performance.

ALD onto Patterned Surfaces

Unlike planar films, from which the refractive index can be reliably measured, confirming the deposition by ALD into the pores of patterned surfaces requires different techniques. To confirm the deposition into the pores using ALD, aluminum oxide ($Al_2O_3$) was deposited onto $TiO_2$ gratings and EDS was used to observe the presence of oxygen, aluminum, and titanium throughout the grating. In this example, 100 cycles of $Al_2O_3$, corresponding to about 10 nm, was deposited into the imprinted lines in order to achieve elemental contrast between the imprinted particles and ALD deposited material.

Following deposition, the change in feature size and in surface texture was observed, confirming the deposition of $Al_2O_3$ by ALD. EDS indicated that oxygen is present throughout the grating, which is as expected, since oxygen is a component of both $TiO_2$ and $Al_2O_3$. The presence of aluminum shows a gradient; aluminum is concentrated on the edges of the grating with diminishing concentration in the grating's interior. The opposite is shown for titanium, with the results indicating titanium is concentrated in the grating's interior. These findings are in agreement with the expected results: $Al_2O_3$ first deposits inside the nanoparticle pores, then continues to deposit conformally on the outside of the grating. With this confirmation, patterned $TiO_2$ NP-based structures were densified with $TiO_2$ from ALD.

For some photonic and metasurface applications, patterned structures with ARs greater than 1 were generated. The pillars were produced by direct patterning, requiring no etching or resist-removal steps and can be scaled to wafer-based production. By contrast, in the case of the modest line gratings, the HAR pillars require a through-stamp annealing treatment before stamp removal to encourage enough binding between the NPs to ensure the pillars do not break during stamp removal. After placing the PDMS stamp onto the NP film, the solvent was allowed to dry out on a hotplate and then the substrate-stamp assembly was subjected to 20 s of NIR irradiation.

The pillars can be effectively patterned over large areas. In order to compare the change in feature dimension from the master and the NP imprints, a UV-curable polymer, NOA60, was imprinted. For the HAR pillar section on the silicon master, the diameter of the imprinted NOA60 pillars is measured to be 140±5 nm at the top of the pillar and the height to be 1.1 μm, resulting in an HAR of 7.9. However, the imprinted $TiO_2$ from the same section measures 130±4 nm in diameter and 815 nm in height, resulting in an HAR of 6.3. Compared to the NOA imprints, the measured shrinkage of the NP pillars with respect to the master is less than 10% in diameter, however, in height the shrinkage is 26%. The shrinkage results from the solvent-assisted imprinting technique; the solvent-dispersed NPs fill the PDMS stamp by capillary forces and then the solvent diffuses through the stamp, resulting in a underfilled mold volume. To achieve specific imprinted feature dimensions the master mold could be fabricated to include the compensation for shrinkage.

HAR $TiO_2$ pillars as-imprinted show the same pillar area after 50 cycles of $TiO_2$ ALD. No obvious change in the structures is observed, indicating that the deposited $TiO_2$ is not simply deposited on the surface. One observed change between the HAR pillars before and after ALD is the slight increase in HAR after ALD, which most likely arises from mild shrinkage from heating during ALD (250° C.).

Tunability of all-Inorganic $TiO_2$ Films

While achieving the highest refractive index possible is desired in many applications, the ability to tune the refractive index over a range of values opens the door to situations requiring precise index tailoring, matching, and/or grading. The films were prepared by spin coating $TiO_2$ NP films for five seconds, and then further dried on a hotplate at 60° C. for two minutes, which mimics the conditions used to generate nanopatterns through solvent-assisted NIL. It should be noted that this results in a slightly lower starting refractive index value (0 cycles ALD). This can be attributed to differences in NP packing; films spin-coated until complete solvent removal pack more densely and have a slightly higher value (1.82 versus 1.77). The refractive index ($n_D$) increases linearly with the number of ALD cycles between 2 and 15, which allows access to intermediate index values, which can be used to fabricate gradient refractive index (GRIN) lenses. This method of tunability benefits from being completely inorganic and composed of a single material. All-inorganic materials are desirable in many applications where durability and UV-stability are concerns. Additionally, by using only $TiO_2$, compatibility between the two materials is ensured.

The terms and expressions that have been employed are used as terms of description and not of limitation, and there is no intention in the use of such terms and expressions of excluding any equivalents of the features shown and described or portions thereof, but it is recognized that various modifications are possible within the scope of the embodiments of the present invention. Thus, it should be understood that although the present invention has been specifically disclosed by specific embodiments and optional features, modification and variation of the concepts herein disclosed may be resorted to by those of ordinary skill in the art, and that such modifications and variations are considered to be within the scope of embodiments of the present invention.

Enumerated Embodiments

The following exemplary embodiments are provided, the numbering of which is not to be construed as designating levels of importance:

Embodiment 1 provides a method of manufacturing a textured surface, comprising:
disposing a template on a substrate; and
planarizing the template with a nanoparticulate ink.

Embodiment 2 provides the method of Embodiment 1, further comprising imprinting the template with a mold comprising a plurality of features that penetrate the template to form an imprinted template.

Embodiment 3 provides the method of any one of Embodiments 1 or 2, wherein the template comprises a crosslinked material.

Embodiment 4 provides the method of any one of Embodiments 1-3, wherein the template comprises a polymeric resin.

Embodiment 5 provides the method of Embodiment 2, wherein the imprinting comprises residual-free imprint lithography.

Embodiment 6 provides the method of Embodiment 2, wherein the imprinting creates imprinted features in the template substantially corresponding in shape and position to the features on the mold.

Embodiment 7 provides the method of Embodiment 6, wherein the nanoparticulate ink substantially fills the imprinted features in the template.

Embodiment 8 provides the method of any one of Embodiments 1-8, wherein the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

Embodiment 9 provides the method of any one of Embodiments 1-9, wherein the method further comprises a first annealing of the imprinted template and substrate.

Embodiment 10 provides the method of Embodiment 8, wherein the first annealing comprises heating, microwave irradiation, visible light irradiation, infra-red irradiation, and ultraviolet irradiation.

Embodiment 11 provides the method of any one of Embodiments 1-10, further comprising removing the template from the substrate.

Embodiment 12 provides the method of Embodiment 11, wherein the removing comprises dissolution, calcination, or irradiation with microwave irradiation, visible light, infra-red radiation, or ultraviolet radiation.

Embodiment 13 provides the method of Embodiment 12, further comprising a second annealing of the substrate and template.

Embodiment 14 provides the method of any one of Embodiments 2-13, wherein the features have a height:width aspect ratio from about 2:1 to about 10:1

Embodiment 15 provides the method of any one of Embodiments 2-14, wherein the features are arranged in a periodic pattern.

Embodiment 16 provides the method of any one of Embodiments 2-15, wherein the features are randomly arranged.

Embodiment 17 provides the method of any one of Embodiments 2-16, wherein the mold comprised at least one substantially flat surface and at least one of the features has a side that forms an acute angle with the mold.

Embodiment 18 provides the method of Embodiment 17, wherein the acute angle ranges from about 10 degrees to about 89 degrees.

Embodiment 19 provides a method of manufacturing a textured surface, comprising:
planarizing an imprinted template with a nanoparticulate ink to form a transfer print master; and
contacting the transfer print master with a substrate.

Embodiment 20 provides the method of Embodiment 19, further comprising:
disposing a template on a first substrate prior the planarizing; and
imprinting the template with a mold comprising a plurality of features that penetrates the template to form the imprinted template.

Embodiment 21 provides the method of any one of Embodiments 19 or 20, further comprising removing the transfer print master to provide a plurality of features disposed on the second substrate.

Embodiment 22 provides the method of any one of Embodiments 19-21, wherein the surface of the template comprises a hard coat.

Embodiment 23 provides the method of Embodiment 20, wherein the imprinted template comprises a crosslinked material.

Embodiment 24 provides the method of any one of Embodiments 19-23, wherein the template comprises a polymeric resin.

Embodiment 25 provides the method of any one of Embodiments 20-24, wherein the imprinting comprises residual-free imprint lithography.

Embodiment 26 provides the method of any one of Embodiments 20-25, wherein the imprinting creates imprinted features in the imprinted template substantially corresponding in shape and position to the features on the mold.

Embodiment 27 provides the method of Embodiment 26, wherein the nanoparticulate ink substantially fills the imprinted features in the imprinted template.

Embodiment 28 provides the method of any one of Embodiments 19-27, wherein the nanoparticulate ink comprises an indium tin oxide (ITO), a titanium dioxide, an aluminum oxide, a silicon dioxide, a metal oxide, a metal nitride, a metal carbide, a metal oxynitride, a metal oxycarbide, a metal boride, a metal silicide, or combinations thereof.

Embodiment 29 provides the method of any one of Embodiments 19-28, wherein the method further comprises annealing the substrate and template.

Embodiment 30 provides the method of Embodiment 29, wherein the annealing comprises heating, microwave irradiation, visible light irradiation, infra-red irradiation, and ultraviolet irradiation.

Embodiment 31 provides the method of any one of Embodiments 19-30, wherein the contacting comprises a sheet-based or roll-to-roll transfer process.

Embodiment 32 provides the method of any one of Embodiments 21-31, wherein the removing comprises dissolution, calcination, or irradiation with microwave irradiation, visible light, infra-red radiation, or ultraviolet radiation.

Embodiment 33 provides an article comprising a textured surface formed by the method of any one of Embodiments 1-32.

Embodiment 34 provides the article of Embodiment 33, wherein the article comprises a lens, a flat lens, a display, a flexible display, a touch panel, a sensor surface, a shielding foil, or a blaze grating.

Embodiment 35 provides an article comprising a textured surface formed by the method of any one of Embodiments 19-34.

Embodiment 36 provides the article of Embodiment 35, wherein the article comprises a lens, a flat lens, a display, a flexible display, a touch panel, a sensor surface, a shielding foil, or a blaze grating.

Embodiment 37 provides a method of manufacturing a textured surface, comprising:
disposing a template on a substrate;
imprinting the template with a mold comprising a plurality of features that penetrate the template to form an imprinted template;
planarizing the imprinted template with a nanoparticulate ink;
annealing the nanoparticulate ink; and
removing the imprinted template;

wherein the imprinting creates imprinted features in the template substantially corresponding in shape and position to the features on the mold;

wherein the nanoparticulate ink substantially fills the imprinted features in the template; and wherein the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

Embodiment 38 provides a method of manufacturing a textured surface, comprising:

disposing a template on a first substrate;

imprinting the template with a mold comprising a plurality of features that penetrate the template to form an imprinted template;

planarizing the imprinted template with a nanoparticulate ink to form a transfer print master;

annealing the nanoparticulate ink;

contacting the transfer print master with a second substrate; and removing the transfer print master to provide a plurality of features disposed on the second substrate;

wherein the imprinting creates imprinted features in the template substantially corresponding in shape and position to the features on the mold;

wherein the nanoparticulate ink substantially fills the imprinted features in the template; and wherein the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof.

Embodiment 39 provides the method of Embodiment 38, further comprising:

performing at least one cycle of atomic layer deposition (ALD) on the imprinted features, wherein the ALD comprises depositing a first reactant and a second reactant;

wherein the first reactant comprises $MX_y$, $MR_y$, $M(NR)_y$, $M(OR)_y$, $MX_yR_z$, $MX_y(NR)_z$, $MX_y(OR)_z$, $MCp_2$, or combinations thereof;

wherein the second reactant comprises water;

wherein each y and z is independently an integer from 2 to 8;

M is a metal;

each X is independently F, Cl, Br, or I;

each R is independently hydrogen or a substituted or unsubstituted $C_{1-20}$ alkyl; and Cp is a substituted or unsubstituted cyclopentadienyl.

Embodiment 40 provides the method of Embodiment 20, further comprising:

performing at least one cycle of atomic layer deposition (ALD) on the imprinted features, wherein the ALD comprises depositing a first reactant and a second reactant;

wherein the first reactant comprises $MX_y$, $MR_y$, $M(NR)_y$, $M(OR)_y$, $MX_yR_z$, $MX_y(NR)_z$, $MX_y(OR)_z$, $MCp_2$, or combinations thereof;

wherein the second reactant comprises water;

wherein each y and z is independently an integer from 2 to 8;

M is a metal;

each X is independently F, Cl, Br, or I;

each R is independently hydrogen or a substituted or unsubstituted $C_{1-20}$ alkyl; and Cp is a substituted or unsubstituted cyclopentadienyl.

Embodiment 41 provides the method of Embodiment 40, wherein the ALD fills pores in the features with $TiO_2$.

Embodiment 42 provides the method of Embodiment 41, wherein the features have a shrinkage of about 1 to 15% after the features are heated at a temperature of about 200° C. to 1000° C. or the features are exposed to light.

Embodiment 43 provides the method of Embodiment 42, wherein the features have a refractive index of about 1.2 to 4.0 after the features are heated at a temperature of about 200° C. to 1000° C. or the features are exposed to light.

Embodiment 44 provides an article comprising:

a surface comprising a plurality of features protruding therefrom, wherein the features have a height:width aspect ratio from about 2:1 to about 10:1.

Embodiment 45 provides the article of Embodiment 44, wherein the features are arranged in a periodic pattern.

Embodiment 46 provides the article of any one of Embodiments 44 or 45, wherein the features are randomly arranged.

Embodiment 47 provides the article of any one of Embodiments 44-46, wherein at least one of the features has a side that forms an acute angle with the surface.

Embodiment 48 provides the article of Embodiment 47, wherein the acute angle ranges from about 10 degrees to about 89 degrees.

Embodiment 49 provides the article of any one of Embodiments 44-48, wherein the features independently have a refractive index of about 1.2 to 4.0.

Embodiment 50 provides the article of Embodiment 49, wherein the features independently have a refractive index of about 1.2 to about 4.0 after the features are heated at a temperature of about 200° C. to 1000° C. or the features are exposed to light.

Embodiment 51 provides the article of any one of Embodiments 44-50, wherein the article comprises a lens, a display, a flexible display, a touch panel, a sensor surface, a shielding foil, a meta lens, a light field display, a flat lens, or a blaze grating.

Embodiment 52 provides the article of any one of Embodiments 44-51, wherein the article is optically transparent.

Embodiment 53 provides the article of Embodiment 52, wherein the article is optically transparent to electromagnetic radiation in a range of from about 400 nm to about 1400 nm.

Embodiment 54 provides the article of any one of Embodiments 52 or 53, wherein the article is optically transparent to electromagnetic radiation in a range of from about 400 nm to about 700 nm.

Embodiment 55 provides the article of any one of Embodiments 52-54, wherein the article is optically transparent to electromagnetic radiation of greater than 905 nm.

Embodiment 56 provides the article of any one of Embodiments 44-55, wherein the article is a virtual reality or augmented reality device.

Embodiment 57 provides the article of any one of Embodiments 44-56, wherein the article is a meta lens or a flat lens.

Embodiment 58 provides a method of manufacturing a textured surface, comprising:

disposing a nanoparticle-based ink on a substrate;

imprinting the ink with a mold comprising a plurality of features to obtain a textured surface, performing at least one cycle of atomic layer deposition (ALD) on the textured surface, wherein the ALD comprises depositing a first reactant and a second reactant;

wherein the first reactant comprises $MX_y$, $MR_y$, $M(NR)_y$, $M(OR)_y$, $MX_yR_z$, $MX_y(NR)_z$, $MX_y(OR)_z$, $MCp_2$, or combinations thereof
wherein
the imprinting creates imprinted features on the substrate wherein the features substantially corresponding in shape and position to the features on the mold;
the nanoparticulate ink substantially fills the features in the mold to create the features;
the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, or combinations thereof,
the second reactant comprises water;
each y and z is independently an integer from 2 to 8;
M is a metal;
each X is independently F, Cl, Br, or I;
each R is independently hydrogen or a substituted or unsubstituted $C_{1-20}$ alkyl; and
Cp is a substituted or unsubstituted cyclopentadienyl.

Embodiment 59 provides an article formed according to the method of Embodiment 58.

Embodiment 60 provides the article of any one of Embodiments 58 or 59, wherein the article comprises:
a surface comprising a plurality of features protruding therefrom, wherein
the features have a height:width aspect ratio from about 2:1 to about 10:1.

Embodiment 61 provides the article of Embodiment 60, wherein the features are arranged in a periodic pattern.

Embodiment 62 provides the article of Embodiment 60, wherein the features are randomly arranged.

Embodiment 63 provides the article of any one of Embodiments 60-62, wherein at least one of the features has a side that forms an acute angle with the surface.

Embodiment 64 provides the article of Embodiment 63, wherein the acute angle ranges from about 10 degrees to about 89 degrees.

Embodiment 65 provides the article of Embodiment 64, wherein the features independently have a refractive index of about 1.2 to 4.0.

Embodiment 66 provides the article of Embodiment 65, wherein the features independently have a refractive index of about 1.2 to about 4.0 after the features are heated at a temperature of about 200° C. to 1000° C. or the features are exposed to light.

Embodiment 67 provides the article of Embodiment 66, wherein the refractive index corresponds to a predetermined refractive index value.

Embodiment 68 provides the article of Embodiment 67, wherein the refractive index is within 5 percent of a predetermined refractive index value.

Embodiment 69 provides the article of any one of Embodiments 60-68, wherein the article comprises a lens, a display, a flexible display, a touch panel, a sensor surface, a shielding foil, a meta lens, a light field display, a flat lens, or a blaze grating.

Embodiment 70 provides the article of any one of Embodiments 60-69, wherein the article is optically transparent.

Embodiment 71 provides the article of Embodiment of any one of Embodiments 60-70 wherein the article has a gradient of refractive index values.

What is claimed is:

1. A method of manufacturing a textured surface comprising an inorganic material, the method comprising:
disposing a nanoparticle ink onto a substrate;
disposing a template comprising a patterned surface onto the disposed nanoparticle ink;
transferring a pattern substantially corresponding to the patterned surface to the nanoparticle ink, to form a textured nanoparticle ink comprising a plurality of features protruding from the substrate and arranged in a periodic pattern or a random pattern, the features having a height:width aspect ratio from about 2:1 to about 10:1; and
performing at least one cycle of atomic layer deposition (ALD) on the textured nanoparticle ink to fill pores in the textured nanoparticle ink and to form the textured surface having a refractive index that is in the range of 1.8 to 2.3 and that is within about 10% of a predetermined refractive index, wherein the textured surface is transparent to electromagnetic radiation throughout a range of about 400 nm to about 1400 nm, and wherein the refractive index of the textured surface is higher than a refractive index of the textured nanoparticle ink.

2. The method of claim 1, wherein the nanoparticle ink comprises:
stabilized nanoparticles; and
a binder.

3. The method of claim 2, wherein the binder comprises a sol gel precursor, a precursor to a material composition substantially similar to the stabilized nanoparticles, a polymer, a siloxane, a silane, a coupling agent, a ligand bound to the nanoparticle, or a combination thereof.

4. The method of claim 1, wherein the nanoparticulate ink comprises an indium tin oxide (ITO), a titanium dioxide, an aluminum oxide, a silicon dioxide, a metal oxide, a metal nitride, a metal carbide, a metal oxynitride, a metal oxycarbide, a metal boride, a metal silicide, a zirconium oxide, or combinations thereof.

5. The method of claim 1 wherein the ALD reduces porosity of the textured surface to less than 25%.

6. The method of claim 1, wherein ALD is used to tune a refractive index of the textured surface to a desired value.

7. The method of claim 1, further comprising treating the textured nanoparticle ink comprising heating and/or exposing to electromagnetic radiation.

8. The method of claim 1, comprising performing at least 50 of the ALD cycles.

9. The method of claim 1, wherein an RMS surface roughness of the textured nanoparticle ink is the same before and after the one or more ALD cycles.

10. The method of claim 1, wherein the nanoparticle ink comprises titanium dioxide.

11. The method of claim 1, further comprising subjecting the textured surface to heating at 200° C. to 1000° C. and/or electromagnetic irradiation.

12. The method of claim 1, wherein the one or more ALD cycles deposit a majority of ALD material into the pores of the textured nanoparticle ink and cause little to no change in dimensions of features of the pattern transferred to the textured nanoparticle ink.

13. The method of claim 1, wherein subjecting the textured surface to heat treating comprising heating at 475° C. for 4 hours results in less shrinkage of a width of the protruding features than subjecting the textured nanoparticle ink to the heat treating.

14. A method of manufacturing a textured surface, the method comprising:

disposing a nanoparticle-based ink on a substrate;
imprinting the ink with a mold comprising a plurality of features to obtain a textured nanoparticle ink comprising a plurality of imprinted features protruding from the substrate and arranged in a periodic pattern or a random pattern, the imprinted features having a height:width aspect ratio from about 2:1 to about 10:1; and
performing at least one cycle of atomic layer deposition (ALD) on the textured nanoparticle ink to fill pores in the textured nanoparticle ink and to form the textured surface having a refractive index that is in the range of 1.8 to 2.3 and that is within about 10% of a pre-determined refractive index, wherein the textured surface is transparent to electromagnetic radiation throughout a range of about 400 nm to about 1400 nm, wherein the refractive index of the textured surface is higher than a refractive index of the textured nanoparticle ink, and wherein the ALD comprises depositing a first reactant and a second reactant;
wherein the first reactant comprises $MX_y$, $MR_y$, $M(R)_y$, $M(OR)_y$, $MX_yR_z$, $MX_y(R)_z$, $MX_y(OR)_z$, $MCp_2$, or combinations thereof,
wherein
the imprinting creates the imprinted features on the substrate wherein the imprinted features substantially correspond in shape and position to the features on the mold;
the nanoparticulate ink substantially fills the features in the mold to create the imprinted features;
the nanoparticulate ink comprises an indium tin oxide, a titanium dioxide, an aluminum oxide, a silicon dioxide, a metal oxide, a metal nitride, a metal carbide, a metal oxynitride, a metal oxycarbide, a metal boride, a metal silicide, zirconium oxide, or combinations thereof;
the second reactant optionally comprises water;
each y and z is independently an integer from 2 to 8;
M is a metal;
each X is independently F, Cl, Br, or I;
each R is independently hydrogen or a substituted or unsubstituted $C_{1-20}$ alkyl; and
Cp is a substituted or unsubstituted cyclopentadienyl.

15. A method of manufacturing a textured surface comprising an inorganic material, the method comprising:
disposing a nanoparticle ink onto a substrate;
disposing a template comprising a patterned surface onto the disposed nanoparticle ink;
transferring a pattern substantially corresponding to the patterned surface to the nanoparticle ink, to form a textured nanoparticle ink comprising a plurality of features protruding from the substrate and arranged in a periodic pattern or a random pattern, the features having a height:width aspect ratio from about 2:1 to about 10:1; and
depositing materials within pores of the textured nanoparticle ink using vapor phase deposition to form the textured surface having a refractive index that is in the range of 1.8 to 2.3 and that is within about 10% of a pre-determined refractive index, wherein the textured surface is transparent to electromagnetic radiation throughout a range of about 400 nm to about 1400 nm, and wherein the refractive index of the textured surface is higher than a refractive index of the textured nanoparticle ink.

* * * * *